(12) United States Patent
Soss et al.

(10) Patent No.: US 7,183,162 B1
(45) Date of Patent: Feb. 27, 2007

(54) METHOD OF FORMING NON-VOLATILE MEMORY CELL USING SACRIFICIAL PILLAR SPACERS AND NON-VOLATILE MEMORY CELL FORMED ACCORDING TO THE METHOD

(75) Inventors: Steven R. Soss, San Jose, CA (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/284,982

(22) Filed: Nov. 21, 2005

(51) Int. Cl.
*H01L 21/8247* (2006.01)

(52) U.S. Cl. .............. 438/264; 438/296; 257/E21.179; 257/E21.209; 257/E21.682

(58) Field of Classification Search ........ 438/257–267, 438/296; 257/E21.179, E21.209, E21.682
See application file for complete search history.

(56) References Cited

U.S. PATENT DOCUMENTS 5,210,047 A * 5/1993 Woo et al. ................ 438/257
6,096,623 A * 8/2000 Lee .......................... 438/425
2003/0119256 A1 * 6/2003 Dong et al. ............... 438/257

* cited by examiner

*Primary Examiner*—Richard A. Booth
(74) *Attorney, Agent, or Firm*—Laleh Jalali

(57) ABSTRACT

A method of forming a microelectronic non-volatile memory cell, a memory cell formed according to the method, and a system including the memory cell. The method comprises: providing a substrate; providing a pair of spaced apart isolation bodies on the substrate, the isolation bodies including respective raised isolation portions, providing the pair comprising providing a buffer layer on the substrate; providing pillar spacers on side walls of the raised isolation portions; removing the buffer layer after providing the pillar spacers; removing the pillar spacers during removing the buffer layer; providing a tunnel dielectric on the surface of the substrate after removing the buffer layer; providing a floating gate on the tunnel dielectric; reducing a height of the isolation bodies to yield corresponding isolation regions; providing source and drain regions on opposite sides of the floating gate; providing an interpoly dielectric on the floating gate; and providing a control gate on the interpoly dielectric to yield the memory cell.

14 Claims, 5 Drawing Sheets

METHOD OF FORMING NON-VOLATILE MEMORY CELL USING SACRIFICIAL PILLAR SPACERS AND NON-VOLATILE MEMORY CELL FORMED ACCORDING TO THE METHOD

FIELD

Embodiments relate to the field of microelectronic manufacturing, and, more specifically, to a method of fabricating a non-volatile memory or flash cell and to a flash cell formed according to the method.

BACKGROUND

The scaling of flash memory cells presents a number of challenges, one of which is to control the amount of floating gate endcap, that is, the amount by which the floating gate of a flash cell overhangs the active substrate of the cells into the isolation regions.

A conventional electrically erasable nonvolatile flash cell 100 is shown in FIG. 1 stacked with other similar cells at each side thereof, only half of each of the similar cells having been shown on each side of cell 100. Flash cell 100 includes polysilicon floating gate 102 formed on the tunnel dielectric 104 which is formed on the silicon region 106. An interpoly dielectric 108 is formed on the polysilicon floating gate, a control gate 110 is formed on the interpoly dielectric layer 108, and a pair of source/drain regions are formed along laterally opposite sidewalls of floating gate electrode 102. To store information in memory device 100, charge is stored on floating gate 102. To erase memory device 100, charge is removed from floating gate 102. A problem with memory storage cell 100 shown in FIG. 1, is that it has become difficult to further scale down its width and length to form smaller area cells and higher density memory circuits. In particular, scaling of the flash cell typically requires that a half pitch of the process node equal two times the floating gate endcap (FGEC), plus two times the interpoly dielectric thickness (IPD), plus the control gate width (CGW), as shown in FIG. 1. Conventionally, FGEC is typically about 10 nm, making the scaling of a 45 nm flash cell extremely challenging, and that of a 32 nm flash cell or lower almost impossible.

Current methods of solving the above problem involve either de-scaling the flash cell, that is, making the cell size larger than the half pitch of the process node described above, and/or by trading the line/space ratio to descale the isolation width, that is, the width of isolation regions such as regions 115 of memory device 100, to allow for material from the isolation region to be laterally etched during the removal of the original buffer oxide layer used as part of a formation of the isolation regions. In other words, the prior art makes the lines smaller, and the spaces much bigger. However, an optimum device performance would occur when the lines are at least equal in width to the spacer, if not wider. Thus, both of the above methods are undesirable to the extent that they trade flash cell performance for process limitations.

The prior art fails to provide a method of forming a flash cell that allows a reliable scaling of the flash cell into the 45 nm range and below.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A method of forming a flash cell using sacrifical spacers, a flash cell according to the method, and a system including the flash cell are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
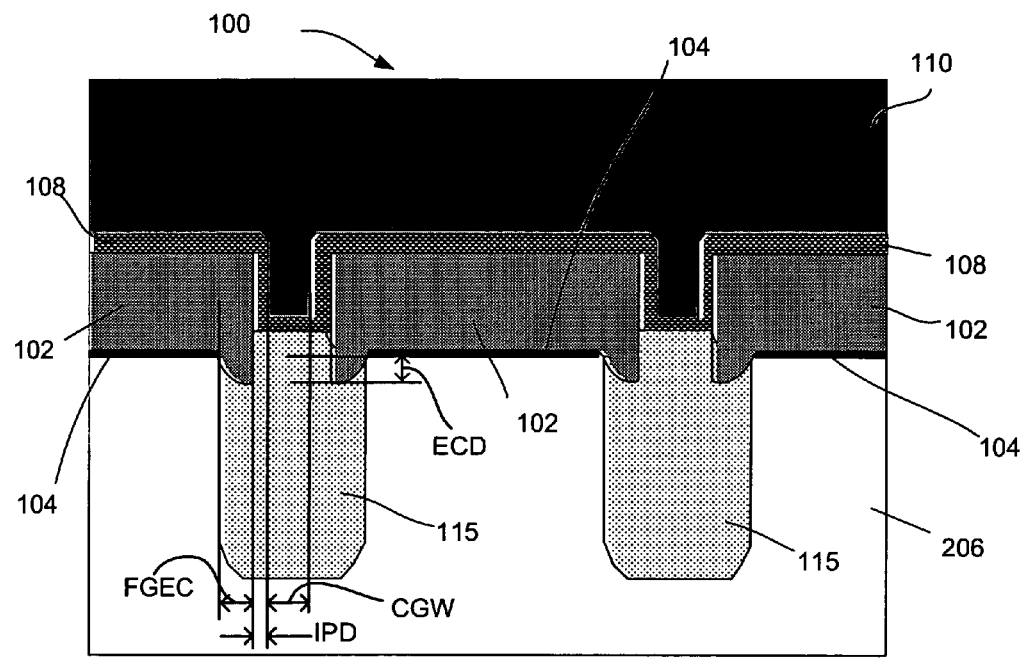
FIG. 1 is a cross-sectional view of a flash cell according to the prior art.
Figure 2:
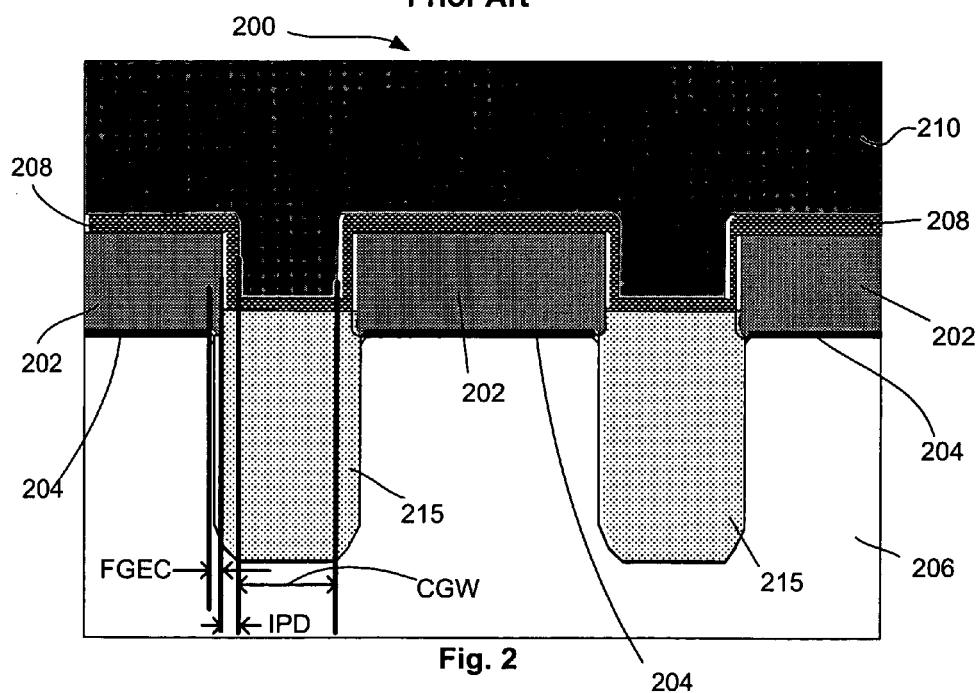
FIG. 2 is a cross-sectional view similar to FIG. 1 showing a flash cell according to an embodiment.

Referring first to FIG. 2, a flash memory cell 200 fabricated according to method embodiments is depicted. Flash cell 200 is, similar to cell 100 of FIG. 1, shown as having been stacked along with other similar cells, only half of the similar cells having been shown on each side of cell 200. Flash cell 200 includes a floating gate 202 formed on the tunnel dielectric 204 which is formed on the substrate region 206. An interpoly dielectric 208 is formed on the floating gate and a control gate 210 formed on the interpoly dielectric layer 208 and a pair of source/drain regions are formed along laterally opposite sidewalls of floating gate 202. Tunnel dielectric is further provided. Contrary to the structure of cell 100 of FIG. 1, where there is present a substantial floating gate endcap extension FGEC, flash cell 200 exhibits a substantial reduction of the FGEC, advantageously allowing sufficient width between adjacent floating gates to support the interpoly dielectric and to allow the control gate to wrap around the floating gate ends for gate coupling control. In addition, advantageously, achieving substantially lower endcap extension of the floating gate allows sufficient isolation between adjacent floating gates, or floating gate lines, to support a poly damascene process in the fabrication of the flash cell. All of the above mentioned advantages contribute to support the possibility of the fabrication of a flash cell where the flash self aligned poly architecture may extend into the 45 nm and further nodes in order to further scale down its width and length to form smaller area cells and higher density memory circuits. In particular, a method of fabricating a structure such as that described herein allows a scaling of the flash cell while not compromising on the desirability that the half pitch of the process node be equal to two times the floating gate endcap (FGEC), plus two times the interpoly dielectric thickness (IPD), plus the control gate width (CGW), as shown in FIG. 2. Preferably, the FGEC in a flash cell according to one embodiment is below about 60 nm. More preferably, the FGEC according to an embodiment is between below about 40 nm. Preferably, According to one embodiment, an amount by which the end cap of the floating gate extends below the upper surface of the silicon, that is, the end cap depth or ECD, is not equal to the FGEC. In this respect, reference is made to FIG. 1, which shows that, in prior art flash cell structures, ECD, as denoted in FIG. 1, is substantially equal to FGEC. However, a flash cell structure according to embodiments, such as that shown in FIG. 2, has an FGEC and ECD that are not equal.

A method of forming a flash memory cell in accordance with embodiments of the present invention will now be explained with respect to cross-sectional illustrations shown in FIGS. 3a–3g.

Figure 3A:
FIGS. 3a–3g show stages of a method embodiment to form the flash cell of FIG. 2.

As shown in FIG. 3a by way of example, a first stage of forming a flash cell according to embodiments comprises providing an substrate including a buffer layer thereon, and an polish stop layer on the buffer layer. The substrate may, in one embodiment, include a silicon substrate 206 as shown. In an embodiment of the present invention the substrate includes a monocrystalline silicon substrate 206. The starting substrate need not, however, be a silicon epitaxial film formed on a monocrystalline silicon substrate and can include other types of substrates. The polish stop layer may, in one embodiment comprise a nitride layer 223 as shown. The buffer layer may, in one embodiment, comprise a buffer oxide layer 221, such as, for example, a layer made of a thermal oxide, a deposited oxide or an oxynitride. The buffer layer may be provided as a stress relief layer between the polish stop layer and the substrate. The buffer layer and the polish stop layer may be provided onto the substrate in any of the manners known to one skilled in the art.

Figure 3B:
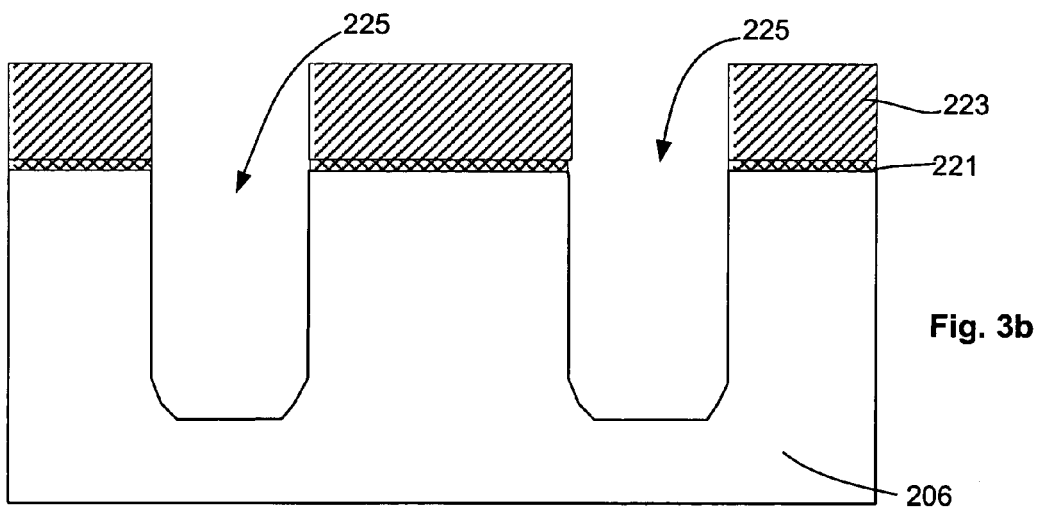

Referring next to FIG. 3b by way of example, a second stage of forming a flash cell according to embodiments comprises providing a pair of isolation recesses into the initial substrate and through the polish stop layer and the buffer layer. Thus, as seen in FIG. 3b, the pair of isolation recesses 225 may be provided into the substrate 206 as shown, through the buffer layer 221 and through the polish stop layer 223. The provision of the pair of isolation recesses may be effected through well know techniques, such as, for example, photolithography, as would be recognized by one skilled in the art. Providing the isolation recesses may further include growing a liner oxide on the side walls of the recesses to passivate the side walls (not shown).

Figure 3C:
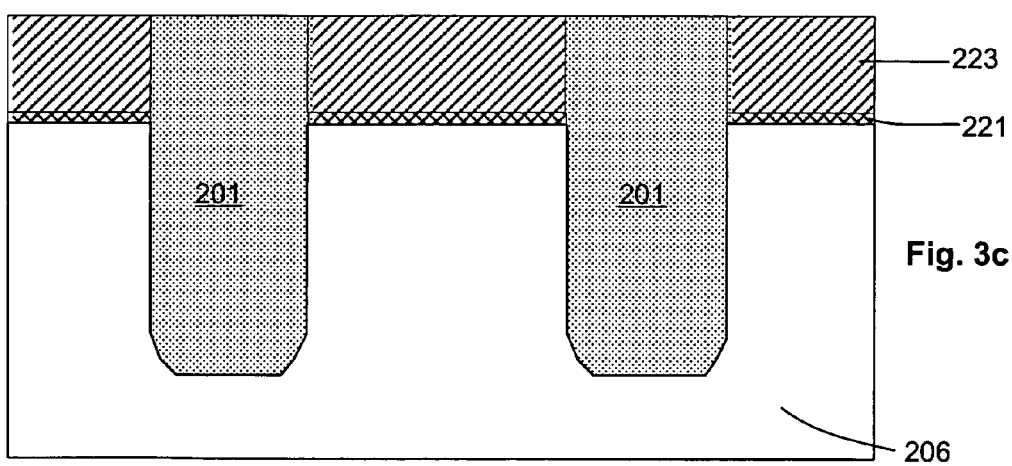

Referring next to FIG. 3c by way of example, a next stage of forming a flash cell according to embodiments comprises filling the pair of isolation recesses with a trench fill material to provide a pair of corresponding isolation blocks. Thus, as seen in FIG. 3c, the pair of isolation recesses 225 is shown as having been filled with a trench fill material to provide the corresponding pair of isolation blocks 201. The trench fill material may, for example, comprise silicon oxide blanket deposited by chemical vapor deposition (CVD), or silicon dioxide formed either by a sequential deposition/etch/deposition process or by a simultaneous deposition-etch process, such as a high density plasma deposition process. Excess trench fill material on a top region of the isolation blocks may then be polished back such as by chemical mechanical polishing (CMP), as would be recognized by one skilled in the art, the polish stop layer 223 acting as a polish stop in order to delimit a top surface of each of the isolation blocks 201.

Figure 3D:
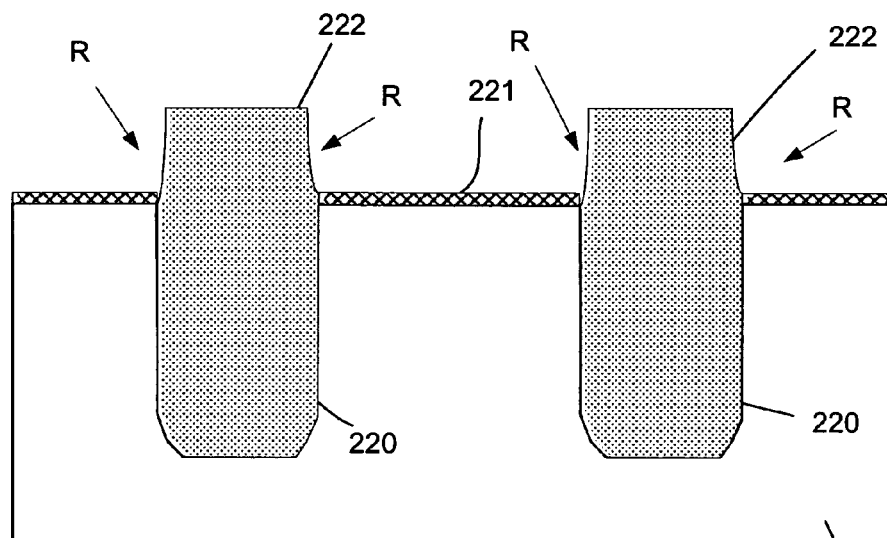

Referring next to FIG. 3d by way of example, a next stage of forming a flash cell according to embodiments comprises removing the polish stop layer to provide a pair of isolation bodies. For example, as shown in FIG. 3d, the polish stop layer may be removed in a well known manner to yield isolation bodies 220 including raised isolation portions 222, that is portions extending above a top surface of the silicon substrate 206. It is noted that a process flow up to a removal of the polish stop layer such as layer 223 may in some instances, as would be recognized by one skilled in the art, result in some etching away of side regions of the raised isolation portions 222, as noted by recesses R in FIG. 3c to result in the isolation bodies. Thus recesses R may for example be caused by ion implantation and clean procedures after removal of the polish stop layer.

Figure 3E:
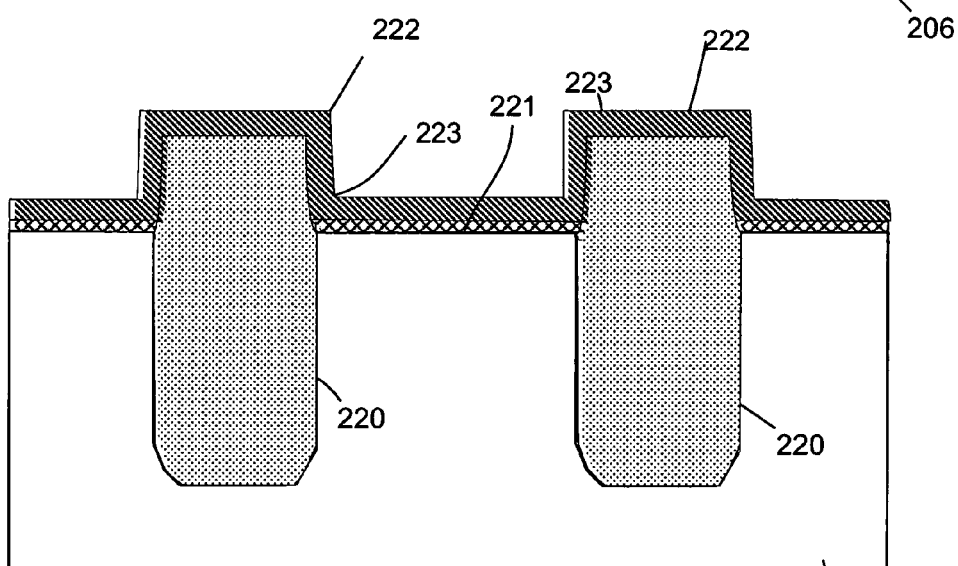
Figure 3F:
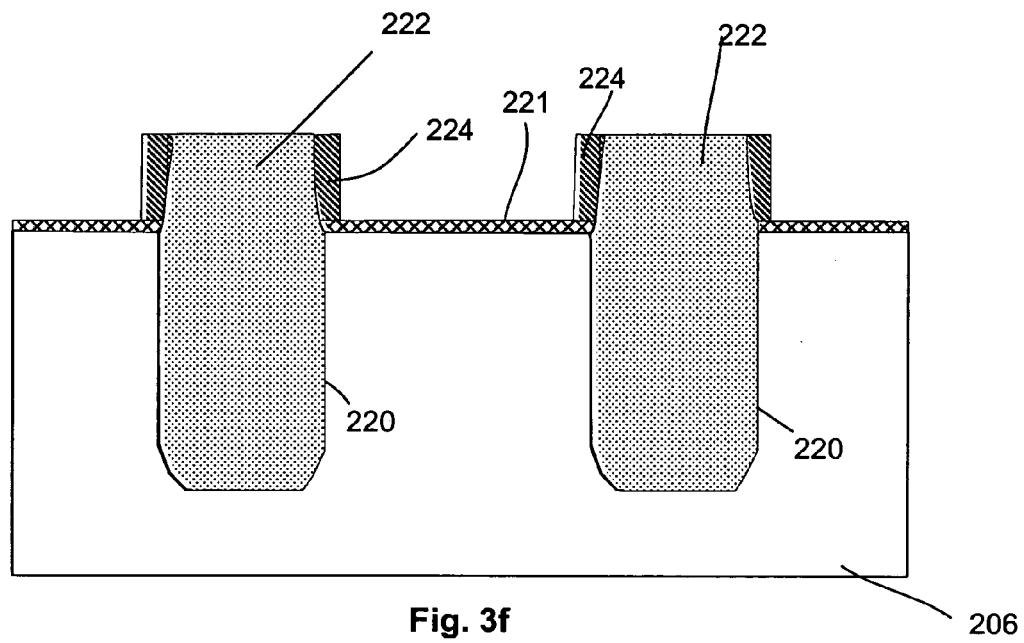

Referring next to FIGS. 3e and 3f by way of example, a next stage of forming a flash cell according to embodiments comprises providing sacrificial pillar spacers on side walls of the raised isolation portions. An element is "sacrificial" in the context of the instant description where it is subject to removal during one or more subsequent stages in the formation of the flash cell. Removal according to embodiments may include partial or total removal. In addition, a sacrifical pillar according to embodiments is described herein as being "consumed" when it is removed. A removal of the sacrificial pillar spacers is shown by way of example in FIG. 3g.

Referring back to FIG. 3f, the pillars may for example be in the form of sacrificial pillar spacers 224 shown in FIG. 3f. In one embodiment, the provision of sacrificial pillar spacers may include an initial provision of a conformal spacer layer on the buffer oxide layer and on the raised isolation portions, and, thereafter, an anisotropic etching of the sacrificial layer in a direction toward the substrate in order to yield the sacrificial pillar spacers. For example, as shown in FIG. 3e, a conformal spacer layer 223 may first be provided onto the buffer layer and onto the isolation bodies. The conformal spacer layer may, for example, include a deposited oxide (such as, HTO, BTBA oxides or TEOS), or PECVD oxides (such as oxynitrides), and may be provided using hotwall CVD, PECVD or rapid thermal CVD. Thereafter, as shown in FIG. 3f, the conformal spacer layer 223 may be anisotropically etched, such as, for example, using a dry etch, to form sacrificial spacers on side walls of the raised isolation portions 222. Types of dry etches that may be used to effect an anisotropic etching of the conformal spacer layer according to embodiments would be within the knowledge of one skilled in the art. A thickness of the spacer layer is determined by at least three factors, which include the amount of lateral etch of the isolation bodies before deposition of the spacer layers, the amount of wet etch required to remove the buffer layer, and the etch rate of the pillar spacers resulting from the spacer layer during a removal of the buffer layer. The thickness of the spacer layer may thus be tuned to ensure that a lateral width of the isolation regions after a removal of the buffer layer is at a desired, predetermined value. Sacrificial spacers such as spacers 224 shown in FIG. 3f may thus extend along sidewalls of raised isolation portions 22 as shown, and down onto the buffer oxide layer 221.

Figure 3G:
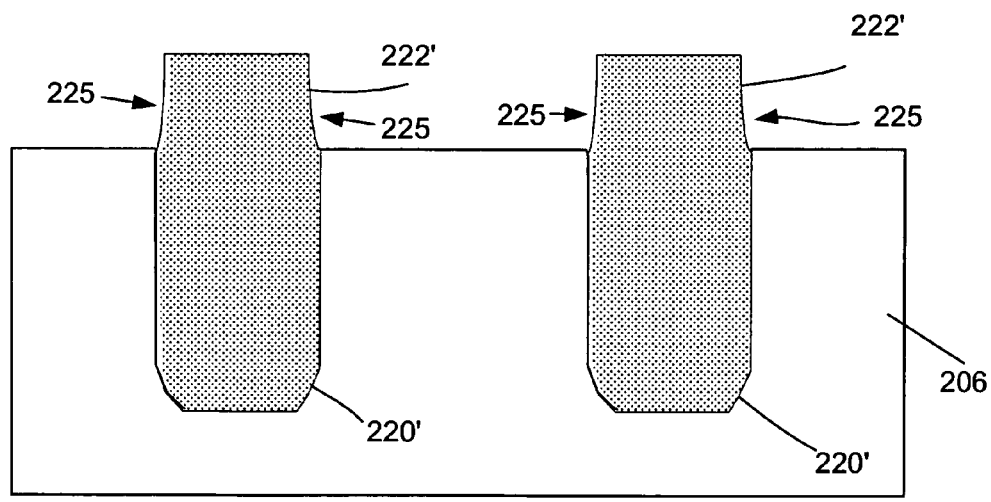

Referring next to FIG. 3g by way of example, a next stage of forming a flash cell according to an embodiment comprises effecting a consuming of the sacrificial pillar spacers by removing the sacrificial pillar spacers during removal of the buffer layer, for example using etching. Thus, as seen by way of example in FIG. 3g, a removal of the sacrificial pillar spacers may occur simultaneously with a removal of the buffer layer. The buffer layer 221 and the sacrificial pillar spacers 224 (FIG. 3f) are shown as having been removed via etching, having left behind modified isolation bodies 220' as shown. The modified isolation bodies 220' include modified raised isolation portions 222'. Where etching, such as an isotropic wet etch, is used to remove the buffer layer 221 and sacrificial pillar spacers 224, removal of the same may additionally result in a slight recessing of the isolation bodies as shown by recesses 225 in modified raised isolation portions 222'. In any event, recesses 225 may extend into the modified raised isolation portions 222' by up to about 60 nm. It is noted, however, that embodiments comprise within their scope a control of the removal of the pillar spacers such that there is substantially no recessing of the isolation bodies, such as, for example, by controlling a thickness of the conformal spacer layer and/or an etch time of the wet etch such that the pillar spacers are either only partially removed to leave corresponding reduced pillar spacers, or such that the wet etch stops exactly at the interface between the pillar spacers and the isolation bodies. Thus, recesses 225 may occur during an etching of buffer layer 221 and sacrificial pillar spacers 224 where the etch may continue beyond the interface between the sacrificial pillar spacers 224 and the trench material of the isolation bodies. To remove the buffer layer and the sacrificial pillar spacers, any suitable wet etch may be used, such as, for example, a wet etch using HF.

Figure 4:
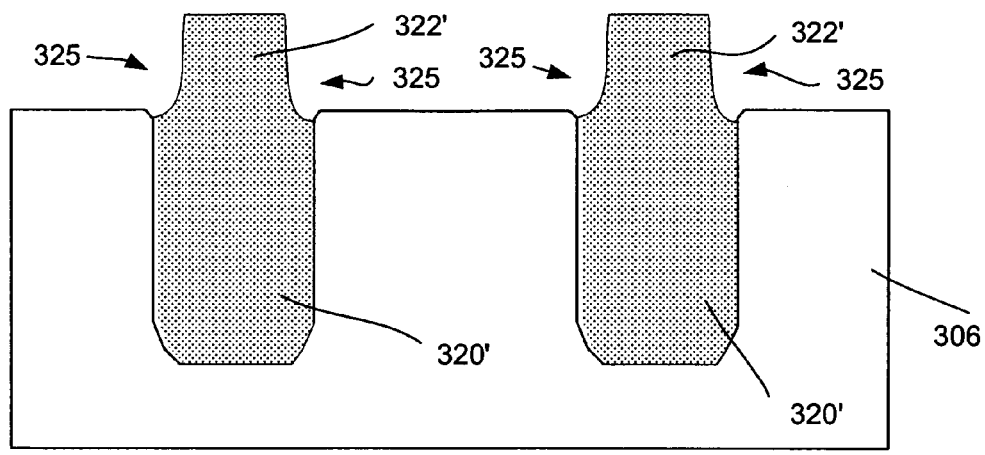
FIG. 4 is a view similar to FIG. 3d showing prior art modified trench isolation regions.

Reference is made now to FIG. 4, which shows a prior art structure similar to FIG. 3d, except that the structure of FIG. 4 corresponds to a structure formed without the use of sacrificial pillar spacers. In particular, FIG. 4 shows a substrate 306 including modified isolation bodies 320'. Modified isolation bodies 320' are different from modified isolation bodies 220' of FIG. 3d in that they include deep recesses 325 as shown, the recesses 325 extending well into the trench isolation material of the isolation bodies 320'. The recessing may, for example, be above about 60 nm. Such recessing in turn brings about the significant floating gate end cap extension as shown for example in FIG. 1, which can make the scaling of flash cells below the 45 nm node difficult.

Subsequent to a removal of the buffer layer and a consumption of the sacrificial pillar spacers, as explained by way of example with respect to FIG. 3g, formation of a flash cell according to an embodiment such as the embodiment of FIG. 2 may continue, as would be recognized by one skilled in the art, according to any standard process flow, including providing: a tunnel dielectric layer (such as tunnel dielectric 204), a floating gate (such as floating gate 202), an interpoly dielectric (such as interpoly dielectric 208), a control gate (such as control gate 210), and source/drain implants. Provision of the floating gate, as is well known, may be effected by depositing a layer of polysilicon and patterning the layer to be self-aligned to the active region (that is, to be self-aligned to the active surface of the substrate). Patterning of the layer of polysilicon corresponding to the floating gate could be effected by either polishing or etching the layer according to conventional techniques. As seen in FIG. 2, the modified raised isolation portions of FIG. 3g are reduced in height, such as through etching, to the levels of the isolation regions such as regions 215 of FIG. 2, after the provision of the floating gates, as would be recognized by one skilled in the art.

Advantageously, embodiments of the present invention provide a method for a precise tailoring of the floating gate endcap extension of a flash cell through the use of a pillar spacer arrangement during a fabrication of the cell. The conventional wet etch used as part of a preparation regimen for the surface onto which the tunnel dielectric is to be deposited tends to disadvantageously etch away parts of the isolation oxide which make room for the subsequent extension of the floating gate endcap. According to method embodiments, a surface to receive the tunnel dielectric may advantageously be prepared independently of the endcap's extension. In addition, advantageously, embodiments allow the scaling of flash cells without compromising the space between adjacent floating gates necessary to support the IPD and the control gate wrap-around. Moreover, embodiments allow both a positive and a negative tuning of the endcap extension. Thus, a positive tuning would correspond to a tuning of the endcap extension into the isolation regions, and a negative tuning would correspond to a tuning of the endcap extension in a direction away from the isolation regions.

Figure 5:
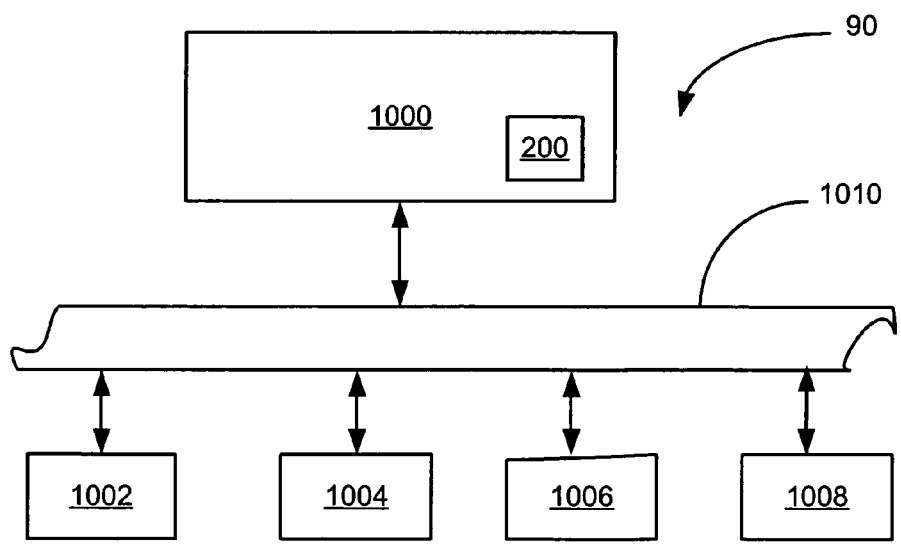
FIG. 5 is a schematic view of a system incorporating a flash cell according to an embodiment.

Referring to FIG. 6, there is illustrated one of many possible systems 900 in which embodiments of the present invention may be used. The electronic assembly 1000 may include a flash cell similar to the flash cell 200 depicted in FIG. 2, or similar to the flash cell 400 depicted in FIG. 5. In one embodiment, the electronic assembly 1000 may include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 6, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of forming a microelectronic non volatile memory cell comprising:
   providing a substrate;
   providing a pair of spaced apart isolation bodies on the substrate, the isolation bodies including respective raised isolation portions, providing the pair comprising providing a buffer layer on the substrate;
   providing pillar spacers on side walls of the raised isolation portions;
   removing the buffer layer after providing the pillar spacers;
   removing the pillar spacers during removing the buffer layer;
   providing a tunnel dielectric on the surface of the substrate after removing the buffer layer;
   providing a floating gate on the tunnel dielectric;
      reducing a height of the isolation bodies to yield corresponding isolation regions, wherein providing the pillar spacers includes:
      providing a conformal spacer layer on the buffer layer and on the raised isolation regions; and
      anisotropically etching the conformal spacer layer in a direction toward the substrate to yield the pillar spacers;
   providing an interpoly dielectric on the floating gate;
   providing a control gate on the interpoly dielectric to yield a floating gate control gate stack; and
   providing source and drain regions on opposite sides of the floating gate-control gate stack to yield the memory cell.

2. The method of claim 1, wherein the buffer layer comprises one of a thermal oxide, a deposited oxide and an oxynitride.

3. The method of claim 1, wherein the conformal spacer layer comprises one of a deposited oxide and a PECVD oxide.

4. The method of claim 1, wherein providing the conformal spacer layer comprises using one of CVD and PECVD.

5. The method of claim 1, wherein anisotropically etching comprises using a dry etch.

6. The method of claim 1, wherein removing the buffer layer and removing the pillar spacers comprises using an isotropic wet etch.

7. The method of claim 6, wherein the wet etch comprises an HF etch.

8. The method of claim 6, wherein removing the buffer layer and removing the pillar spacers comprises controlling the isotropic wet etch such that the isolation regions are substantially unaffected by the wet etch.

9. The method of claim 6, wherein removing the buffer layer and removing the pillar spacers comprises controlling the isotropic wet etch such that the isolation regions are recessed by the wet etch by a predetermined recess amount.

10. The method of claim 9, wherein the predetermined recess amount is below about 60 nm.

11. The method of claim 9, wherein the predetermined recess amount is below about 40 nm.

12. The method of claim 1, wherein reducing a height comprises etching.

13. The method of claim 1, wherein providing the isolation bodies comprises:
   providing a polish stop layer on the buffer layer;
   providing a pair of spaced apart isolation recesses into the substrate through the polish stop layer and the buffer layer; and
   filling the isolation recesses with trench fill material to provide a corresponding pair of isolation blocks;
   polishing excess trench fill material on a top region of the isolation blocks up to the polish stop layer; and
   removing the polish stop layer after polishing to obtain corresponding isolation bodies.

14. The method of claim 13, wherein the trench fill material comprises one of silicon oxide and silicon dioxide.

* * * * *